United States Patent [19]

Emery et al.

[11] Patent Number: 4,771,355
[45] Date of Patent: Sep. 13, 1988

[54] SYSTEM AND METHOD FOR ARC DETECTION IN DYNAMOELECTRIC MACHINES

[75] Inventors: F. T. Emery, Pittsburgh; R. T. Harrold, Murrysville Boro, both of Pa.

[73] Assignee: Electric Power Research Institute, Inc., Palo Alto, Calif.

[21] Appl. No.: 947,197

[22] Filed: Dec. 29, 1986

[51] Int. Cl.[4] .............................................. H02H 7/00
[52] U.S. Cl. ....................................... 361/33; 361/23; 361/6; 324/546
[58] Field of Search ................... 361/20, 21, 31, 33, 361/23; 324/158 MQ, 545, 546

[56] References Cited

U.S. PATENT DOCUMENTS

| 3,396,339 | 8/1968 | Miram. | |
|---|---|---|---|
| 3,882,379 | 5/1975 | Kang | 324/54 |
| 4,052,665 | 10/1977 | Gruenwald | 324/54 |
| 4,149,208 | 4/1979 | Fiorentzis | 361/20 X |
| 4,156,846 | 5/1979 | Harrold et al. | 361/31 X |
| 4,224,652 | 9/1980 | Fiorentzis | 361/20 X |
| 4,286,238 | 8/1981 | Ursenbach | 333/206 |
| 4,356,443 | 10/1982 | Emery | 324/51 |
| 4,363,061 | 12/1982 | Vaercuyck et al. | 361/31 |
| 4,446,426 | 5/1984 | Emery et al. | 324/158 MQ |
| 4,636,708 | 1/1987 | Whyte | 361/100 X |
| 4,638,396 | 1/1987 | Makli et al. | 361/101 |

FOREIGN PATENT DOCUMENTS

| 670995 | 6/1979 | U.S.S.R. | 361/23 |
|---|---|---|---|
| 1058890 | 2/1967 | United Kingdom. | |

*Primary Examiner*—Philip H. Leung
*Assistant Examiner*—Derek S. Jennings
*Attorney, Agent, or Firm*—Flehr, Hohbach, Test, Albritton & Herbert

[57] ABSTRACT

System and method of detecting arcing faults in dynamoelectric machines by monitoring the voltage on the neutral grounding lead to detect RF voltages produced by arcing in the machine. The voltage is monitored by an RF voltage coupler and an RF monitor having a high impedance input amplifier. In one embodiment, the voltage coupler is clamped onto the neutral lead, and in another it is connected electrically in series with it.

8 Claims, 2 Drawing Sheets

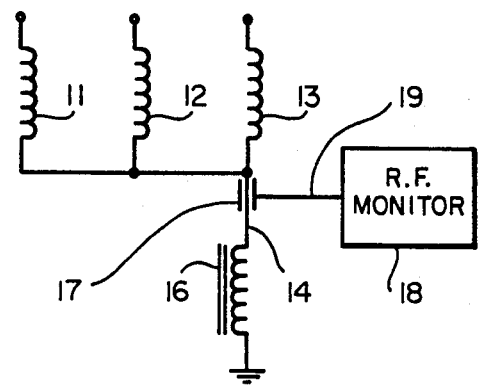
FIG_1
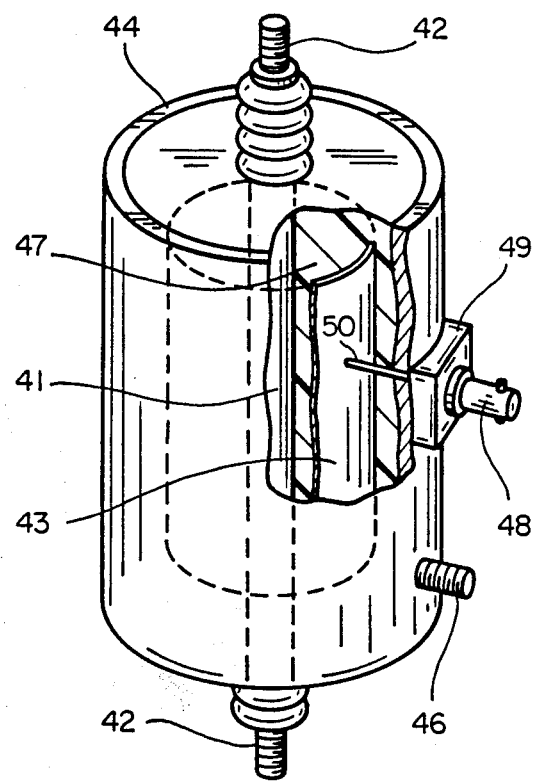
FIG_4

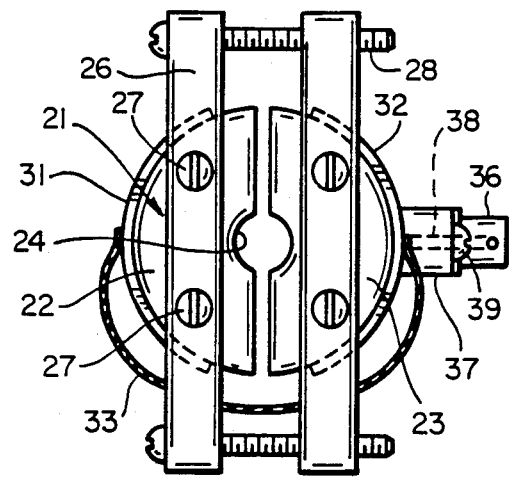
FIG_2
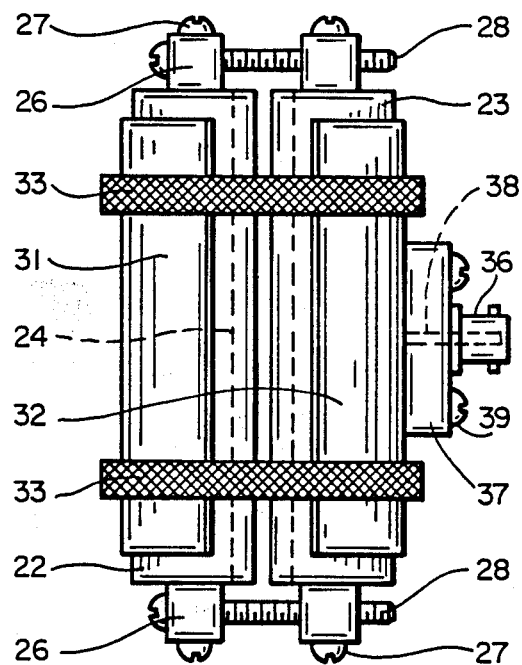
FIG_3

SYSTEM AND METHOD FOR ARC DETECTION IN DYNAMOELECTRIC MACHINES

This invention pertains generally to dynamoelectric machines and more particularly to a system and method for detecting arcing faults in large dynamoelectric machines such as turbine generators.

Internal arcing in a large dynamoelectric machine such as a turbine generator can damage the machine extensively, resulting in costly, long term outage of the machine. Such arcing can be caused by component failures such as stator winding insulation failures, copper fatigue or voltage breakdown because of reduced clearance between components. The arcs produced by these malfunctions cause radio frequency (RF) pulses of fast rise time and short duration to propagate through the generator stator winding.

Prior art techniques for detecting arcing in large generators have included temperature sensors and means for detecting the emission of particulate matter from the insulation of the stator winding. These techniques are dependent on the occurrence of abnormal temperatures and do not detect faults at as early as stage as would be desirable.

U.S. Pat. No. 4,156,846 discloses a method for detecting the occurrence of such arcing faults by monitoring the RF current in the neutral grounding lead of the generator.

This method utilizes the fact that neutral currents due to arcing have a characteristic frequency distribution which can be predicted from the resonant characteristics of the current path and is distinctly different from the frequency distribution of neutral currents resulting from other causes such as corona discharge within insulation voids. By monitoring the neutral current for this characteristic frequency distribution, the occurrence of an arcing fault can be detected at a relatively early stage.

The neutral grounding lead is commonly connected to the ground by a grounding transformer, and the relatively high impedance of the transformer limits the magnitude of the neutral RF current. This limits the sensitivity and ability to detect an arcing fault in the stator winding. With a dry-type neutral transformer, the ability to detect an arcing fault is less than it is with an oil-filled transformer due to the substantially higher impedance of a dry-type transformer. With the replacement of oil-filled neutral transformers with-dry-type transformers, it is becoming increasingly difficult to detect arcing faults with a RF current monitoring technique.

It is in general an object of the invention to provide a new and improved system and method for detecting arcing faults in dynamoelectric machines.

Another object of the invention is to provide a system and method of the above character which overcome the limitations and disadvantages of techniques heretofore employed for detecting arcing faults.

These and other objects are achieved in accordance with the invention by monitoring the voltage on the neutral grounding lead of a dynamoelectric machine to detect RF voltages produced by arcing in the machine. The voltage is monitored by an RF voltage coupler connected to an RF monitor having a high impedance input amplifier. In one embodiment, the voltage coupler is clamped onto the neutral lead, and in another it is connected electrically in series with it. It has been found that an increase in sensitivity greater than an order of magnitude is obtained by monitoring the neutral lead voltage as compared with the prior art technique of current monitoring.

FIG. 1 is a schematic diagram of one embodiment of an arcing fault detector according the invention illustrated in connection with the stator windings and the neutral grounding transformer of a dynamoelectric machine.

FIG. 2 is top plan view of one embodiment of an RF voltage coupler for use in the arcing fault detector of FIG. 1.

FIG. 3 is a side elevational view of the voltage coupler of FIG. 2.

FIG. 4 is an isometric view, partly broken away, of another embodiment of RF voltage coupler according to the invention.

In FIG. 1, the invention is illustrated in connection with the stator windings 11-13 of a turbine generator or another dynamoelectric machine. These windings are commonly connected in three-phase circuit having a neutral conductor or lead 14 which is connected externally to ground by a grounding transformer 16. The occurrence of arcing faults in the generator is detected by monitoring the RF voltage in the neutral lead between the stator windings and the transformer. An RF voltage coupler is coupled to the neutral lead for this purpose, and an RF monitor 18 comprising a voltage amplifier having a high input impedance monitors the RF voltage level at the neutral lead of the generator. The voltage coupler is connected to the RF monitor by a coaxial cable 19.

Under normal generator operating conditions, the voltage between the generator neutral point and ground is on the order of 300 volts RMS. This voltage is developed by the third harmonic (180 Hz) current flow resulting from slight imbalance in the phase currents. A generator fault condition can cause the neutral voltage to increase to the full output voltage of the machine which in some cases can be as high as 30 KV RMS. In contrast, the RF voltages produced at the neutral point by arcing faults are on the order of millivolts.

In order to safely and accurately measure RF voltages at the neutral point of an on-line generator, the RF voltage coupler must be capable of measuring RF voltages at a level on the order of millivolts, while continuously withstanding and blocking third harmonic (180 Hz) voltages of up to about 400 volts RMS. At the 60 Hz operating frequency of the machine, the combined impedance of the coupling circuit and the RF voltage monitor should be at least ten times greater than the high frequency impedance of the neutral transformer to prevent the voltage coupler from affecting the ground protection scheme of the generator. The RF voltage coupler should also be capable of blocking the generator line-to-ground voltage (30 Kv RMS) from the RF monitor for a time of at least 100 milliseconds to prevent shunting of the neutral ground protection circuitry during the occurrence of a generator fault condition. In addition, the voltage coupler should have a known transfer function when used in conjunction with the RF monitor.

In the preferred embodiments, the voltage coupler 17 comprises a coaxial capacitor, with neutral grounding lead 17 forming one plate of the capacitor. FIGS. 2-3 illustrate an embodiment of a coaxial capacitor which can be clamped onto a neutral lead, and FIG. 4 illustrates a coaxial capacitor which can be can be connected permanently in series with the neutral lead.

In the embodiment of FIGS. 2–3, the voltage coupler has a split body 21 having a pair of generally semicylindrical body sections 22, 23 with an axial bore 24 adapted to receive the neutral lead or conductor of the generator. With a bore diameter of 0.375 inch, the coupler can be used with neutral conductor from about 0.375 inch to 1.0 inch in diameter. Parallel bars 26 are affixed to the upper and lower ends of body sections 22, 23 by screws 27, and draw bolts 28 extend between the parallel bars and provide means for drawing the two body sections together.

Body sections 22, 23 are fabricated of an electrically insulative material having a high dielectric strength. In one presently preferred embodiment, the body sections are fabricated of a Micarta material having a dielectric strength of approximately 350 volts/mil. With a radial thickness of 0.675 inch, the body sections have a dielectric strength of about 236 Kv which is more than adequate for most installations. In this embodiment, bars 26 are also fabricated of Micarta, and screws 27, 28 are fabricated of nylon. Semi-cylindrical plates 31, 32 are affixed to the outer surfaces of body sections 22, 23 and positioned coaxially of the neutral conductor received in bore 24. These plates are fabricated of an electrically conductive material such as brass, and they are connected together electrically by braided copper conductors 33. An electrical connection with the outer plates is made by a BNC connector 36 mounted an insulative block 37 on plate 32. The connector has an inner conductor 38 which is connected electrically to plate 32. Mounting block 37 is secured to plate 32 and body section 23 by screws 39. In this particular embodiment, block 37 is fabricated of Micarta, and screws 39 are fabricated of nylon.

The capacitance of the voltage coupler is given by the relationship $$C = \frac{5.56\, K \times 10^{-13}}{\log_n (b/a)}$$

where K is the dielectric constant of the insulative material, a is the radius of the center conductor, b is the radius of the outer conductor or plate, and the capacitance is given in units of farads per centimeter of length. With a Micarta body and outer plates having a diameter of 1.75 inch and a length of 2.75, the capacitor has a capacitance on the order of 13.3–17.6 pF, depending upon the diameter of the neutral conductor.

The voltage coupler illustrated in FIG. 4 has an axially extending center conductor 41 with threaded terminals 42 for connection to the neutral conductor of the generator. In one presently preferred embodiment, the center conductor 41 is fabricated of a copper rod having a diameter of 0.375 inch.

A cylindrical outer conductor 43 is positioned coaxially about center conductor 41, and these two conductors form the plates of the coaxial capacitor. The outer conductor is fabricated of an electrically conductive material such as brass, and in a presently preferred embodiment it has a diameter of 2.375 inches and a length of 4.0 inches.

A cylindrical outer shield 44 prevents external signal interference from reaching the voltage coupler. This shield has a terminal 46 for connection to ground. In the embodiment discussed above, this shield has a diameter of 4.375 inches and a length of 5.50 inches. The region within the shield is filled an epoxy material 47.

Electrical connections with outer conductor 43 are provided by a BNC connector 48 mounted on an insulative block 49 on the outer shield. This connector has an inner conductor 51 which is connected electrically to plate 43.

The capacitance of the voltage coupler of FIG. 4 is determined by the same relationship as the capacitance of the voltage coupler of FIGS. 2–3. With the dimensions given above, the voltage coupler of FIG. 4 has a capacitance on the order of 20 pF.

Operation and use of the arc detector, and therein the method of the invention, are as follows. The voltage coupler is coupled to the neutral conductor either by clamping the coupler about the conductor (FIGS. 2–3) or by connecting it permanently in series with the neutral conductor (FIG. 4). When the generator is in operation, RF voltages produced by arcing faults are coupled to monitor 18 by the RF voltage coupler, but the coupler isolates the monitor from other signals such as the 180 Hz voltage produced by the phase imbalance.

The voltage coupler system and method have been found to be substantially more sensitive than RF current monitoring in detecting arcing faults. Tests were conducted with a voltage coupler of the type shown in FIGS. 2–3 in conjunction with an impedance matching amplifier and a spectrum analyzer at a power station to obtain RF measurements on an 835 MVA fossil fired generator. With the generator on-line at a gross load of 725 MW, the RF voltage spectrum was measured over the frequency range of 5 KHz to 10 MHz. Arcing was simulated by an AC arcing relay and a sine wave sweep generator connected between adjacent phases at the line end of the generator stator. Measurements were taken both with and without the simulated arcing to obtain both arc simulation RF data and on-line background RF data. Using this data, the AC arc voltage sensitivity of the system was calculated.

The AC arcing simulation signal measured at the generator neutral was higher than the background RF signal over the frequency range of 1 MHz to approximately 6 MHz. A 6 volt RMS arcing relay connected to the line terminals of the generator caused the neutral RF voltage to peak at a signal level of −56 dBm at a frequency of 3 MHz. The background level of RF noise voltage with generator on-line reached a level of −880 dBm. Using these two measured signal levels of neutral RF and the criteria that the minimum detectable signal level caused by generator stator arcing is 20 dBm above the background RF noise level, a minimum detectable value of AC arc voltage developed by a stator winding arcing condition was calculated. Based on the measured background RF noise voltage of −80 dBm, a minimum detectable RF arcing signal of −60 dBm is required. The minimum detectable magnitude of AC arc voltage which will produce a measured neutral signal of −60 dBm is:

$$V_{min} = 6\,VRMS(224\,\mu V/400\,\mu V) = 3.36\,VRMS$$

Using similar calculations, the minimum level of arc voltage which can be detected by monitoring the neutral current was determined to be 86 volts RMS. These calculations show that the arc detection sensitivity of the RF voltage coupler is over 25 times that of the current monitoring technique.

It is apparent from the foregoing that a new and improved system and method for arc detection in dynamoelectric machines has been provided. While only certain presently preferred embodiments have been described in detail, as will be apparent to those skilled in the art, certain changes and modifications can be made without departing from the scope of the invention as defined by the following claims.

We claim:

1. In a system for detecting an arcing fault in a dynamoelectric machine operating at a relatively low power line frequency and having a neutral grounding lead: a radio frequency voltage coupler coupled to the neutral lead for passing high frequency signals and blocking voltages at the power line frequency, and a radio frequency monitor connected to the voltage coupler for detecting a radio frequency voltage produced in the neutral lead by arcing in the machine.

2. The system of claim 1 wherein the voltage coupler is capacitively coupled to the neutral lead.

3. The system of claim 2 wherein the voltage coupler comprises a generally cylindrical electrically conductive plate disposed coaxially of the neutral lead, with the neutral lead and the generally cylindrical plate forming a coaxial capacitor, the radio frequency monitor being connected to the generally cylindrical plate.

4. The system of claim 3 wherein the generally cylindrical plate is clamped about the neutral lead.

5. The system of claim 3 wherein the voltage coupler includes a central conductor connected electrically in series with the neutral lead and positioned coaxially within the generally cylindrical plate.

6. The system of claim 1 wherein the radio frequency monitor comprises a radio frequency voltage amplifier having a high input impedance.

7. The system of claim 1 wherein the voltage coupler is connected to the radio frequency monitor by a coaxial cable.

8. In a method of detecting an arcing fault in a dynamoelectric machine having neutral grounding lead: monitoring the neutral lead with a radio frequency voltage monitor to detect a radio frequency voltage produced by arcing in the machine.

* * * * *